United States Patent [19]

Beitman

[11] Patent Number: 4,795,718

[45] Date of Patent: * Jan. 3, 1989

[54] SELF-ALIGNED CONTACT FOR MOS PROCESSING

[75] Inventor: Bruce A. Beitman, Palm Bay, Fla.

[73] Assignee: Harris Corporation, Melbourne, Fla.

[*] Notice: The portion of the term of this patent subsequent to Jun. 21, 2005 has been disclaimed.

[21] Appl. No.: 57,398

[22] Filed: May 12, 1987

[51] Int. Cl.$^4$ .......................................... H01L 21/302
[52] U.S. Cl. ..................................... 437/41; 437/228; 437/240; 437/247; 437/982; 148/DIG. 133; 156/653; 156/657; 357/23.1
[58] Field of Search ...................... 437/41, 42, 40, 43, 437/186, 187, 188, 225, 228, 238, 240, 247, 982; 148/DIG. 51, DIG. 133, DIG. 134; 156/653, 657; 357/23.1

[56] References Cited

U.S. PATENT DOCUMENTS

| | | | |
|---|---|---|---|
| 3,925,572 | 12/1975 | Naber | 437/982 |
| 4,157,269 | 6/1979 | Ning et al. | 148/DIG. 124 |
| 4,279,671 | 7/1981 | Komatsu | 148/DIG. 124 |
| 4,299,862 | 11/1981 | Donley | 437/982 |
| 4,364,165 | 12/1982 | Dickman et al. | 437/48 |
| 4,397,077 | 8/1983 | Derbenwick et al. | 437/48 |
| 4,577,394 | 3/1986 | Peel | 148/DIG. 133 |

FOREIGN PATENT DOCUMENTS 0246640  12/1985  Japan ....................... 148/DIG. 133

Primary Examiner—Brian E. Hearn
Assistant Examiner—Kevin McAndrews
Attorney, Agent, or Firm—William A. Troner; Leslie J. Hart; C. C. Krawczyk

[57] ABSTRACT

A process for manufacturing an insulated gate field effect semiconductor device having self-aligned contact regions. The process avoids the need for a masking step for the application of interconnecting contacts by providing a dielectric material having a low melting point over the gate region of the semiconductor. The dielectric material is heated to its melting point such that it covers and encapsulates the gate. Contact material is then subsequently provided using the self-alignment feature of the melted dielectric which isolates the gate from the contacts.

21 Claims, 5 Drawing Sheets

SELF-ALIGNED CONTACT FOR MOS PROCESSING

FIELD OF THE INVENTION

The present invention relates generally to semiconductors, and more specifically, to the process of producing semiconductors having self-aligned contacts and the products resulting therefrom.

BACKGROUND OF THE INVENTION

In the present era of very large scale integration, new techniques are needed to more efficiently utilize the space within the semiconductor devices. Certain practical limitations, however, in today's manufacturing process of semiconductors require portions of semiconductor material to be used merely for providing spacing to compensate for such limitations. Such use of semiconductor material occurs in the process of providing interconnecting contacts for the semiconductor devices.

In the manufacture of integrated circuits, interconnecting contacts are provided between the active semiconductive material in which the semiconductor devices are formed, and the interconnect lines. These contacts are typically formed by initially depositing an oxide layer over the top surface of the semiconductor device. A masking layer of photoresist is then provided over the oxide and patterned for exposing the oxide in the contact area. The exposed oxide is then etched, followed by the nonselective deposition of a conducting layer such as aluminum, over the wafer. The conducting layer is then patterned and etched to form the interconnecting contacts.

Inherent in the masking step for patterning the contact areas is the high probability of misaligning the masking layer over the oxide. This misalignment of the masking layer leads to the misalignment of the interconnecting contacts. Additionally, there exists the potential of overetching the oxide layer during the etching process, which can result in enlarging the size of the contact areas. Either of these occurrences, e.g., the misalignment of the mask or the overetching of the oxide, can short the contacts for the active device regions with the gate of the semiconductor. To avoid this potential for shorting the gate, extra semiconductor material of approximately 2 microns in width is typically provided on each side of the intended location for the contacts such that any potentially misaligned or enlarged contact will be prevented from shorting the active regions with the gate. This usage of unused active semiconductor area, however, is a loss of valuable semiconductor real estate which might otherwise be used for additional semiconductor devices.

SUMMARY OF THE INVENTION

It is, therefore, an object of the present invention to provide a new and improved process for producing semiconductor devices.

It is another object of the invention to provide a process for producing semiconductor devices having smaller dimensions.

It is still another object of the present invention to reduce the unused active semiconductor area previously required for the area around the contacts.

It is further an object of the present invention to substantially reduce the possibility of shorting the active regions of the semiconductor devices with the gate region, by way of eliminating the potential for misalignment or overetching.

It is still further an object of the present invention to eliminate a masking step in the manufacturing of the semiconductor devices, thereby increasing the yield output of the semiconductor product.

These and other objects are attained by a process which provides for self-aligning interconnecting contacts. In accordance with a preferred embodiment of the invention, the active silicon region where the contacts are to be formed, is initially covered with a thin dielectric layer for the gate oxide. A first layer of conductive material such as a polycrystalline silicon is then deposited on the dielectric layer to serve as the gate, followed by a deposition of a second dielectric layer over the conductive layer. The second dielectric layer is chosen such that it has a melting temperature which is lower than the melting temperatures of the other layers. The second dielectric layer is selectively removed over the areas where a conductive layer is not needed. The now exposed areas of the first conducting layer are selectively removed such that the thin dielectric layer is exposed over the location for the active regions. The remaining conductive layer at this point has exposed side surfaces.

The process of selectively removing the dielectric and conducting layers is commonly referred to as patterning and can be performed in a number of known methods. One such method may include the application of a photoresist, exposing selected areas of the photoresist by use of mask, developing the photoresist for exposing selected areas of the underlying material and subsequent etching the exposed underlying material.

The second layer of dielectric material is now heated to its melting temperature such that the dielectric material will flow on the exposed side surfaces of the first conductive layer. The melted dielectric will serve to self-align the contacts when a conductive material is subsequently provided. The exposed thin dielectric layer is selectively removed such that the active silicon is exposed. The conductive material such as a salicide or silicide is deposited or grown over the exposed surface of the active silicon, thereby providing the interconnecting contact points to the respective active regions.

In an especially preferred embodiment, the source and drain regions are implanted or diffused into the active silicon prior to the heating of the dielectric layer. If a lightly doped drain (LDD) is preferred, the initial implant or diffusion is of a light dosage, with a subsequent heavier implant or diffusion provided after the heating of the second layer of dielectric. Additionally, field oxide layers are initially provided by known methods such as by local oxidation for providing isolation between devices.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

DETAILED DESCRIPTION OF THE DRAWINGS

FIGS. 1-7 are enlarged cross-sectional views illustrating a sequence of steps used in the fabrication of a semiconductor structure in accordance with a preferred embodiment of the invention.

Figure 1:
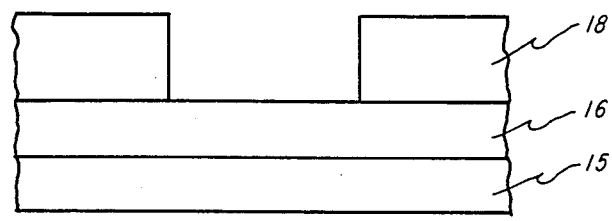
FIGS. 1-7 are cross-sectional views illustrating a sequence of steps in the fabrication of a semiconductor structure in accordance with a preferred embodiment of the invention.
Figure 2:
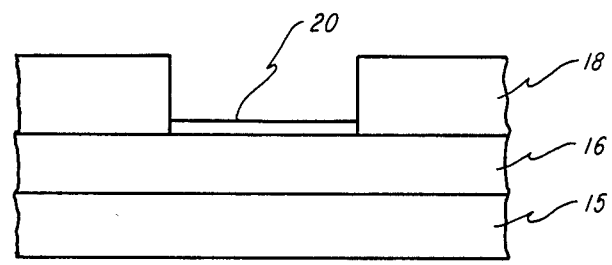

Specifically, FIGS. 1-7 show a planar MOS process wherein self-aligned contacts are provided without the standard masking step required in the prior art. In FIG. 1, a passivated epitaxial semiconductor is represented. In a particular embodiment, a substrate 15 is provided formed of a monocrystalline silicon wafer of N-type conductivity as produced by heavy doping with a donor impurity such as arsenic. The substrate may include an N-type epitaxial layer 16 of approximately 6 $\mu$m thick. Field oxide regions 18 shown in FIG. 1 are provided for isolating the respective semiconductor devices, and may comprise thermally grown oxide or oxide provided by vapor deposition. By way of example, a field oxide layer 18 of approximately 10,000 Angstroms thick is deposited uniformly across the top planar surface of the epitaxial layer 16. A masking layer (not shown) of photoresist is applied and patterned such that subsequent etching with a chlorine or flourine plasma will remove the field oxide layer where the active regions and gate are to be located. A gate oxide 20 of approximately 300 to 1000 Angstroms is then selectively grown on the exposed top surface of the epitaxial layer 16.

A layer 25 of polycrystalline silicon is deposited on a top surface of the gate oxide by a low pressure chemical vapor deposition (LPCVD). This layer is approximately 6000 Angstroms and is doped with phosphorous in a diffusion oven to lower the polycrystalline layer 25 resistance.

Figure 3:
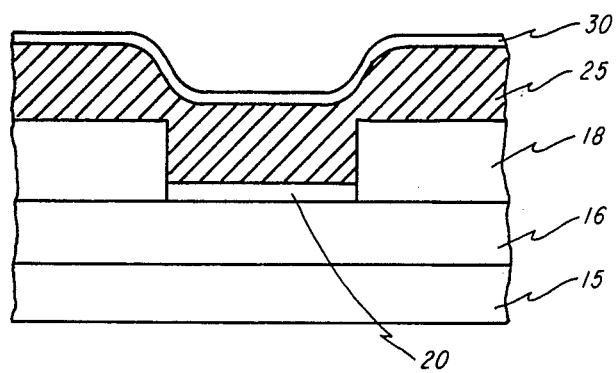
Figure 4:
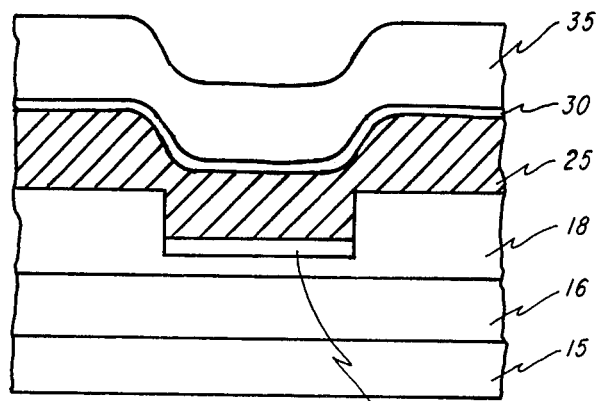

An oxide layer 30 of approximately 500 Angstroms is now grown on the polysilicon, as shown in FIG. 3. This oxide layer 30 should provide better adhesion of the subsequent dielectric layer 35. A dielectric layer 35 of approximately 6000 Angstroms is deposited on a top surface of the oxide layer 30 as shown in FIG. 4. The dielectric layer 35 is chosen of a composition such that it has a melting temperature which is lower then the melting temperatures of the other layers. A doped silica glass 35 such as Borophosphosilicate glass (BPSG) provides such a material having a melting temperature of approximately 900° C.

Figure 5:
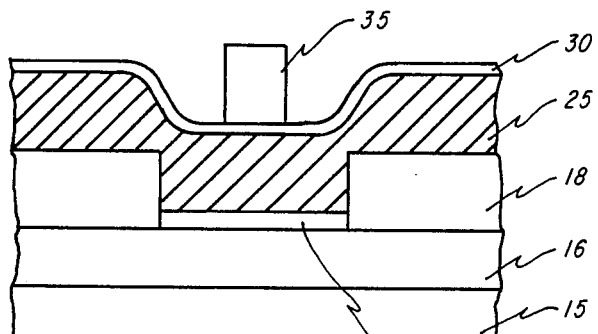
Figure 6:
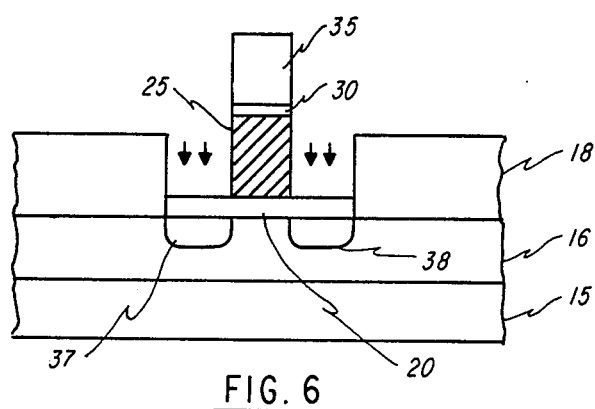

A masking layer of photoresist is now applied and patterned on the glass layer 35 such that the glass 35 and oxide 30 layers may be etched away except for the area covering the area to be defined as the gate as seen in FIG. 5. After the photoresist is removed, the polycrystalline silicon layer 25 is etched by using a plasma etch or reactive ion etch (RIE) using the composite oxide layer 30 and glass layer 35 as a mask as shown in FIG. 6. The field oxide regions 18 and gate oxide 20 act as etch stops for this etching process.

The source and drain regions 37 and 38 can now be formed by known methods of implanting or diffusing of dopants. When lightly doped drains (LDD) are preferred, this implant or diffusion should be of a light dosage e.g. $1 \times 10^{14}/\text{cm}^2$ for phosphorous doping. If an LDD is not preferred, a normal implant or diffusion doping of approximately $1 \times 10^{16}/\text{cm}^2$, may be performed at this stage in the process.

The combined wafer is now heated to the melting temperature of the doped glass layer 35, which for BPSG is approximately 900° C. The heating is continued for approximately one hour or at least until the glass layer flows completely over the exposed surfaces of the polycrystalline silicon layer 30 as seen in FIG. 7.

Once the polycrystalline layer 30 is completely encapsulated, the heating may be discontinued. During this heating process, the desired effect of activating the implanted or diffused dopants for the active devices also occurs. If an LDD structure is preferred such that the earlier implant or diffusion was of a light dosage, a second implant or diffusion of dopants of a heavier dosage, e.g. $1 \times 10^{16}/\text{cm}^2$ is to be performed. The structure is then heated a second time for activating the second doping. This subsequent activation, however, will be at a temperature which is lower than the melting temperature of the doped glass layer 35. If an LDD structure is not desired, this second implant need not be performed.

Figure 7:
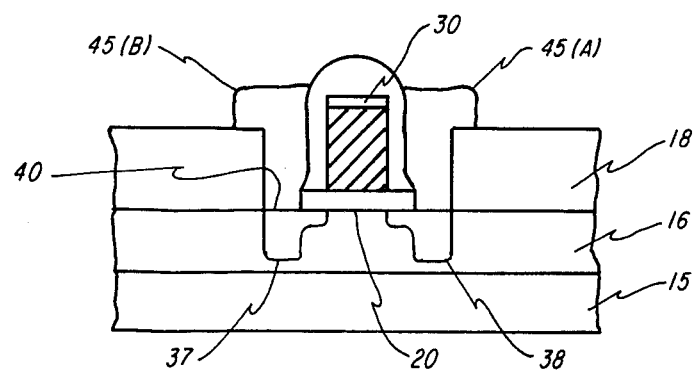
Figure 8:
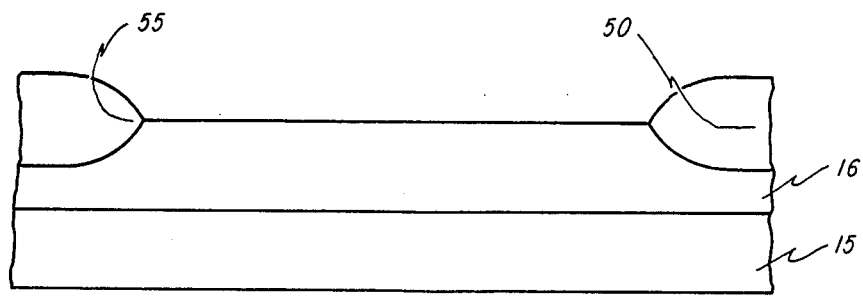
FIGS. 8-14 are cross-sectional views illustrating a sequence of steps of another preferred embodiment of the invention.
Figure 9:
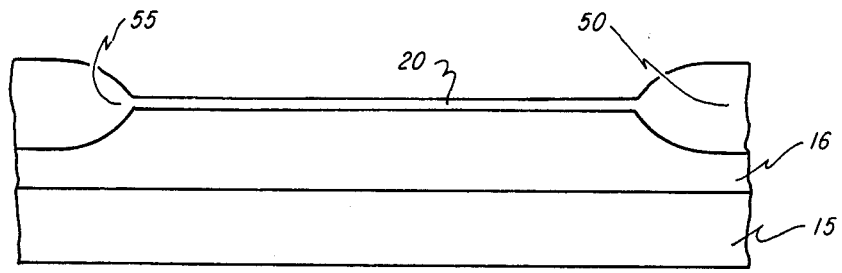
Figure 10:
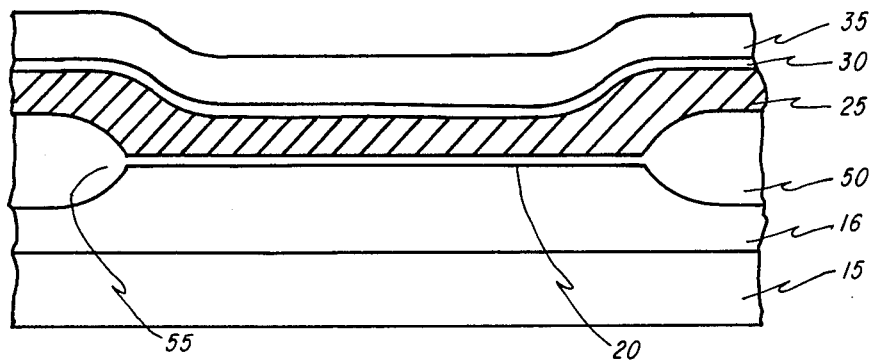
Figure 11:
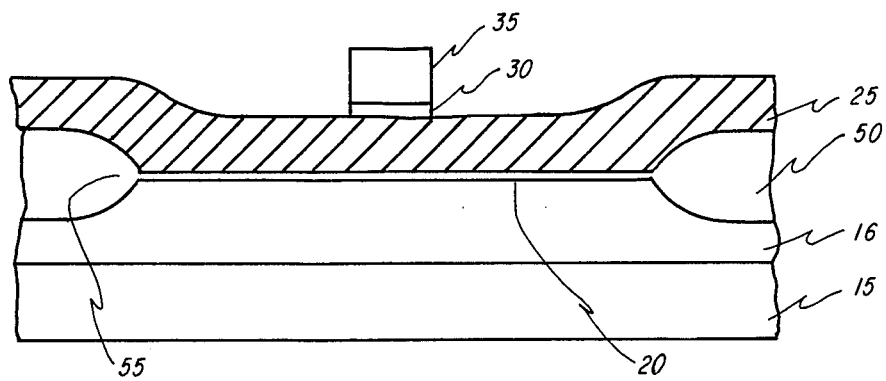

The exposed gate oxide layer 20 is now etched by using a buffered hydroflouric acid for approximately 2 minutes, resulting in exposing the top surface 40 of the epitaxial layer 16 formed on the substrate 15 as seen in FIG. 7. A second conductive layer 45 such as a salicide or a silicide is either deposited or grown by known methods, thereby providing the interconnecting contacts 45(a) and 45(b) to the respective source 37, and drain 38 regions. Alternatively, a metal such as aluminum can be provided in lieu of a salicide or silicide, if preferred.

As can be seen, the areas for the interconnecting contacts are formed without the need of a separate mask and etching operation as required in the prior art. By using and incorporating a doped glass layer 35 in the process, the glass can be melted to encapsulate the polysilicon gate layer 25 such that a mask layer is not needed. As a result, there is no potential for misalignment of a mask layer nor the potential of overetching a thick oxide layer to form the contact areas. The added active silicon used to compensate for these potential occurrences is therefore, no longer necessary resulting in the formation of smaller devices. Additionally, due to the elimination of a masking step in the manufacture of a semiconductor wafer, the manufacturing yields in the production of the semiconductor devices should improve.

In another preferred embodiment of the invention as shown in FIGS. 8-14, a local oxidation process is implemented. The field oxidation regions 50 are provided by using known local oxidation techniques. By way of illustration, the local oxidation process includes providing a pad oxide layer of approximately 200 Angstroms on a top surface of an epitaxial layer 16 formed on a silicon substrate 15. A layer of silicon nitride of approximately 1500 Angstroms is then nonselectively deposited on the top surface of the pad oxide over the area where the active devices and channel region are to be formed in the substrate. The wafer is then heated to approximately 1050° C. in an oxidizing atmosphere for approximately five hours. The field oxide grows to about 10,000 Angstroms forming at its edges what is commonly referred to as a birds beak 55. The oxide layer over the silicon nitride is removed in buffered hydroflouric acid followed by the removal of the silicon nitride layer using a hot phosphoric acid. The thin layer of oxide now exposed from the removal of the silicon nitride is also removed in buffered hydroflouric acid.

Figure 12:
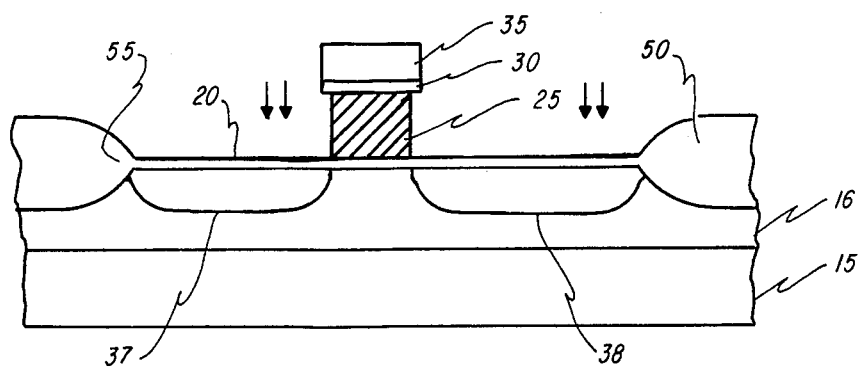

A gate oxide 20 of approximately 300 to 500 Angstroms is grown similar to the process in the previous embodiment. Similarly, the polycrystalline silicon layer 25, the thermally grown oxide layer 30 and the doped silica glass layer 35 are provided and selectively removed as in the first preferred embodiment, as shown in FIGS. 9-12. As shown in FIG. 12, the etching can cause undercutting of the polycrystalline silicon layer 25 such that the polycrystalline layer 25 will be thinner than the composite oxide 30 and doped silica glass 35 layers.

Figure 13:
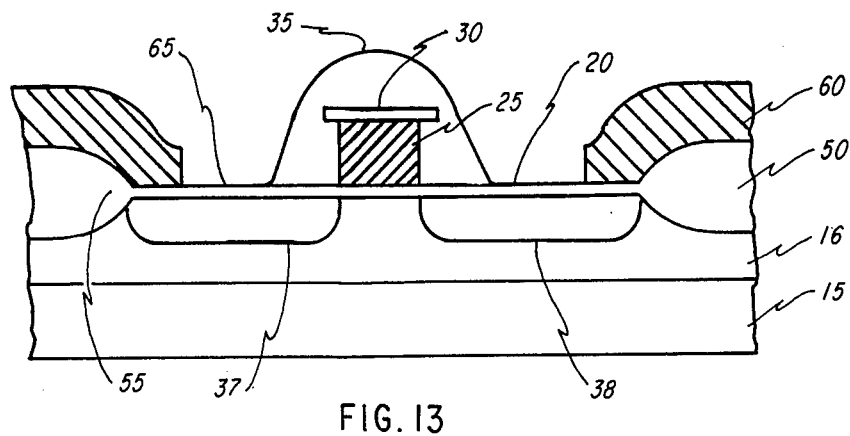

The active devices 37 and 38 can now be implanted or diffused into the epitaxial layer of the substrate. Similar to the preceding embodiment, if a lightly doped drain (LDD) is preferred, this implant or diffusion will be of light dosages of dopants, e.g. $1 \times 10^{14}/cm^2$. The wafer is heated to the melting temperature of the doped silica glass layer, e.g. 900° C. for BPSG for 1 hour or at least until the glass layer 35 melts and flows to encapsulate the polycrystalline layer 25 as shown in FIG. 13. If a LDD is preferred, a second implant or diffusion can now be performed of a heavier dosage of dopants, e.g. $1 \times 10^{16}/cm^2$.

Figure 14:
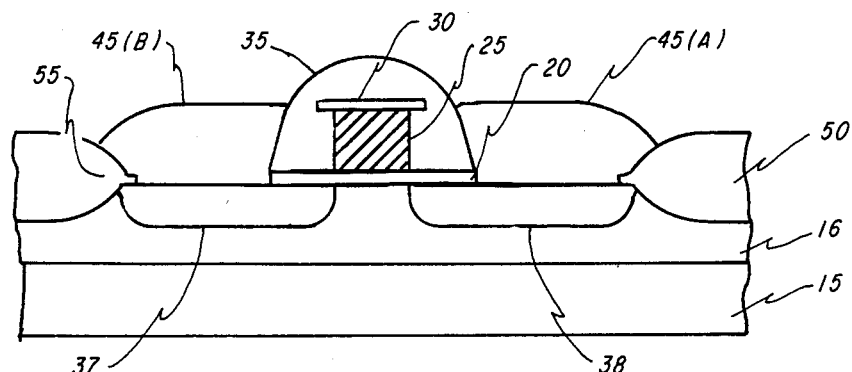

The exposed areas of the gate oxide 20 are now etched away, resulting in exposing the top surface 65 of the epitaxial layer 16 over the active source 37 and drain 38 regions. However, prior to the etching of the layer, a photoresist layer 60 is provided over the field oxide region 50 extending over the edge of the field oxide and into the thin gate oxide layer 20. The photoresist 60 will protect the birds beak 55 area of the field oxide 50 during the etching of the exposed gate oxide 20. Without this protection, the birds beak could be etched as well, thereby resulting in shorting the source 37 or drain 38 region to the body. After the etching of the gate oxide 20, the photoresist 60 is removed and the contact material is selectively provided over the exposed top surface of the substrate active regions as shown in FIG. 14. As with the a previous embodiment, the contact material may be of a salicide, silicide, metal or any other conductive material.

The doped silica glass 35 and oxide layer 30 thereunder are selectively removed prior to the etching of the polycrystalline silicon layer 25 in both the preferred embodiments discussed above. This is suggested as a preferred implementation because of the convenience in using the etched glass 35 and oxide 30 layers as a mask for the etching of the polycrystalline layer 25. It is noted, however, that alternative processing variations can be implemented without deviating from the scope and spirit of the invention. One such variation would include etching the polycrystalline layer 25 prior to providing the doped silica glass layer 35. The oxide layer 30 and glass layer 35 would then be selectively deposited on the exposed top surface of the polycrystalline silicon layers 25. The remaining process steps would be similar to the steps used in the preceeding preferred embodiments.

It is further noted that although the particular embodiments have been described in which silicon is the semiconductor material, germanium devices may also be constructed in accordance with the invention, as well as III-IV type compound semiconductor devices.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A process of manufacturing a semiconductor device comprising:
    (a) providing a substrate having a first surface;
    (b) providing a first dielectric layer over said first surface of said substrate;
    (c) providing a first conductive layer over said first dielectric layer;
    (d) providing a second dielectric layer over said first conductive layer;
    (e) patterning said second dielectric layer, and using said second dielectric layer as a mask for patterning said first conductive layer;
    (f) patterning said first conductive layer and exposing side surfaces of said first conductive layer;
    (g) heating said semiconductor device to a predetermined temperature such that said second dielectric layer flows and covers said side surfaces of said first conducting layer, said second dielectric layer forming means for aligning a contact area;
    (h) removing said first dielectric layer from said contact area;
    (i) providing a second conductive layer to said contact area.

2. The process of claim 1, wherein said predetermined temperature is lower than a melting temperature of said first dielectric layer and said first conductive layer.

3. The process of claim 2, wherein said second dielectric layer includes doped silica glass and said first conductive layer includes a polycrystalline silicon.

4. The process of claim 3, wherein said substrate is of a first conductivity type, said process further comprising providing active device regions of a second conductivity type in said substrate under said exposed first dielectric layer prior to removing said exposed areas of said first dielectric layer.

5. The process of claim 4, wherein said doped silica glass includes Borophosphosilicate (BPSG), wherein heating includes heating said BPSG to approximately 900° C., wherein said heating induces said BPSG layer to melt and flow over the exposed side surfaces of said first conductive layer.

6. The process of claim 5, wherein said substrate includes silicon, and said second conductive layer includes a salicide, said salicide providing interconnecting contacts to said active device regions.

7. The process of claim 6, wherein said active device regions include source and drain regions and are provided by implanting dopants of said second conductivity type, said process further comprising implanting said dopants a second time after heating said doped silica glass layer, said first implant being of a lighter dosage of dopants relative to said second implant for forming lightly doped drains.

8. The process of claim 6, further comprising providing an oxide layer on said top surface of said conductive layer before providing said doped silica glass thereon, wherein said composite silica glass and oxide layer are patterned for exposing said selected areas of said conductive layer thereunder, wherein said exposed areas of said conductive layer are then patterned for exposing said first dielectric thereunder.

9. The process of claim 5, wherein said second conductive layer includes a metal, said metal providing contact points to said respective active regions.

10. A process for forming an insulated gate field effect semiconductor wafer comprising the steps of:
  (a) selectively forming a plurality of field oxide regions on a first surface of a substrate such that an active area region is defined between said field oxide regions;
  (b) providing a thin layer of oxide over the active area region on said first surface of said substrate;
  (c) providing a conductive layer over said thin layer of oxide;
  (d) providing a dielectric layer over said conductive layer, wherein said dielectric layer flows when heated to a preselected temperature;
  (e) selectively removing said first dielectric layer and exposing selected areas of said conductive layer thereunder;
  (f) selectively removing said exposed regions of said conductive layer and exposing selected areas of said thin oxide layer thereunder, wherein side surfaces of said conductive layer are exposed as a result of said removal of said exposed regions thereof;
  (g) heating said dielectric layer to said preselected temperature for melting said dielectric layer and covering said exposed side surfaces of said conductive layer;
  (h) selectively removing said exposed thin oxide and exposing said first surface of said substrate thereunder; and
  (i) selectively providing a second conductive layer over said exposed portions of said substrate.

11. The process of claim 10, wherein said dielectric layer includes an insulating material having a melting temperature which is lower than a melting temperature of said thin oxide and first conducting layers.

12. The process of claim 11, wherein said insulating material includes a doped silica glass.

13. The process of claim 12, wherein said substrate is of first conductivity type, said rocess further comprising the step of providing a source and drain regions of a second conductivity type in said substrate after selectively removing said dielectric layer and said conductive layers.

14. The process of claim 13, wherein said heating of said dielectric layer includes heating said doped silica glass to approximately 900° C., wherein said heating induces said doped silica glass layer to melt and flow over the exposed surfaces of said conductive layer while also activating said source and drain regions.

15. The process of claim 14, further comprising the step of providing a second oxide layer on said conductive layer before providing said doped silica glass thereon, wherein said composite silica glass and second oxide layer are patterned and etched for exposing said conductive layer thereunder, wherein said exposed conductive layer is patterned and etched for exposing said thin layer of oxide thereunder.

16. The process of claim 14, wherein said field oxide regions are selectively formed by a local oxidation and includes a birds beak at an edge of said field oxide regions, said process further comprising the step of providing a masking layer over the edge of said field oxide regions before selectively removing said exposed thin oxide, wherein said masking layer overlaps the junction between said field oxide and said thin layer of oxide for protecting said birds beak of said field oxide during the subsequent removal of said exposed thin oxide.

17. The process of claim 14, wherein said field oxide regions are selectively formed by providing a layer of oxide covering said top surface of said substrate and patterning said field oxide layer such that said active area region is exposed, wherein said field oxide layer is formed substantially on said top surface of said substrate.

18. The process of claim 14, wherein said substrate includes silicon and said second conductive layer includes a silicide, said silicide providing respective interconnecting contacts to said source and drain regions.

19. The process of claim 14, wherein said second conductive layer includes a metal, said metal providing respective interconnecting contacts to said source and drain regions.

20. The process of claim 14, wherein said source and drain regions are formed by implanting dopants of said second conductivity type using a light dosage, said process further comprising the step of implanting said dopants of said second conductivity type a second time after said heating of said doped silica glass, said second implanting being at a heavier dosage relative to said first implant, wherein lightly doped drain (LDD) regions are formed.

21. A process for the formation of an insulated gate field effect semiconductor having self-aligned contacts, said process comprising the steps of:
  (a) providing a substrate having a top surface;
  (b) selectively forming a gate oxide on selected areas of said top surface of said substrate;
  (c) selectively forming a first layer of conductive material on said gate oxide, wherein said gate oxide is wider than said first conductive layer such that said gate oxide has an exposed top surface on both sides of said first conductive layer, and said first conductive layer providing the gate for said semiconductor, said gate having exposed top and side surfaces;
  (d) selectively providing a doped silica glass layer on said exposed top and side surfaces of said gate, such that said glass layer does not completely cover said exposed top surface of said gate oxide;
  (e) selectively removing said exposed surfaces of said thin gate oxide layer to expose said top surface of said substrate thereunder; and
  (f) selectively providing a second layer of conductive material on said exposed top surface of said substrate.

* * * * *